United States Patent
Gagey et al.

(10) Patent No.: US 7,269,232 B2
(45) Date of Patent: Sep. 11, 2007

(54) DEVICE FOR PRODUCING A PHASE AND AMPLITUDE MODULATED RADIO FREQUENCY SIGNAL

(75) Inventors: Olivier Gagey, Paris (FR); Christophe Molko, Suresnes (FR); Fabrice Belveze, Cornillon (FR)

(73) Assignee: Nortel Networks France, Chateaufort (FR)

( * ) Notice: Subject to any disclaimer, the term of this patent is extended or adjusted under 35 U.S.C. 154(b) by 919 days.

(21) Appl. No.: 10/240,061

(22) PCT Filed: Mar. 28, 2001

(86) PCT No.: PCT/FR01/00940

§ 371 (c)(1), (2), (4) Date: Mar. 24, 2003

(87) PCT Pub. No.: WO01/76169

PCT Pub. Date: Oct. 11, 2001

(65) Prior Publication Data

US 2004/0037364 A1     Feb. 26, 2004

(30) Foreign Application Priority Data

Mar. 31, 2000     (FR) .................................. 00 04124

(51) Int. Cl.
    *H03C 1/52*     (2006.01)
    *H04L 27/04*    (2006.01)

(52) U.S. Cl. ...................... 375/300; 375/295; 332/103; 332/144

(58) Field of Classification Search ................ 375/300, 375/295; 332/103, 144

See application file for complete search history.

(56) References Cited

U.S. PATENT DOCUMENTS 3,619,503 A     11/1971 Ragsdale

OTHER PUBLICATIONS

Mann S. et al. : "Increasing talk-time with efficient linear PA'S"—IEE seminar on tetra market and technology developments, Feb. 10, 2000, pp. 6/1-6/7—§ 4.3-§ 4.4-§ 5a.

Liu W. et al.: "Considerations on applying OFDM in a highly efficient power amplifier"—IEEE transactions on circuits and systems-II, analog and digital signal processing, vol. 46, No. 11, Nov. 1999, pp. 1329-1336—§ IV.B Fig. 6.

Wu J—T et al. : "TP 5.2: A 2V 100 MhZ CMOS vector modulator" IEEE international solid state circuits conference, vol. 40—Feb. 1997, pp. 80-81, 434, Fig. 1.

*Primary Examiner*—David C. Payne
*Assistant Examiner*—Erin M. File
(74) *Attorney, Agent, or Firm*—Trop, Pruner & Hu, P.C.

(57) ABSTRACT

The invention concerns a device for producing a phase and amplitude modulated signal (G) suitable for radio transmission via an antenna (30), based on the EER technique and means (20) for temporal clamping of a phase controlling signal (D) and an amplitude controlling signal (F) so that the phase modulating component is synchronized with the amplitude modulating component in the output signal (G).

21 Claims, 5 Drawing Sheets

DEVICE FOR PRODUCING A PHASE AND AMPLITUDE MODULATED RADIO FREQUENCY SIGNAL

FIELD OF THE INVENTION

The present invention relates to a device for producing a phase and amplitude modulated radiofrequency signal suitable for radio transmission via an antenna.

Such a device finds applications in radiofrequency transmitters, especially of mobile radio communication stations.

BACKGROUND OF THE INVENTION

Current radio communication systems conventionally use, for transmitting digital data coding an audio signal or, more generally, information of any nature, so-called constant-envelope modulations. With such modulations, the data transmitted are not carried by the amplitude of a radiofrequency carrier but by its phase or its frequency. This makes it possible to use in the transmitter a radiofrequency power amplifier operating in an operating zone close to saturation. Thus, the transmitter exhibits high efficiency in terms of power, this being required especially within the framework of using the transmitter in portable radio communication equipment. Specifically, as is known, in such an operating zone the transmitter exhibits amplification nonlinearities comprising amplitude nonlinearities and, to a lesser extent, phase nonlinearities. These nonlinearities create amplitude and phase distortion of the signal transmitted, which degrade the performance of the transmitter in terms of transmission quality. It is in order to circumvent the problem of amplitude nonlinearities that only constant-envelope modulations are used in current radio communication systems. Specifically, since the useful information is not carried by the amplitude of the radiofrequency signal transmitted, the amplitude nonlinearities do not affect the quality of transmission.

However, it is currently sought to transmit more information inside a frequency band of given width, assigned to a transmission channel, so as to increase the spectral efficiency of radio communication systems. The aim is to respond to the rise in traffic demand within the radiofrequency spectrum while complying with the constraints related to the sharing of this spectrum. This is why the reintroduction of an amplitude modulation is envisaged. Thus, it is sought to perfect new radio communication systems using a composite modulation, comprising both a phase modulation component and an amplitude modulation component, for the transmission of information.

Despite this, the need to maintain high transmitter efficiency in terms of power, is reason to continue to operate the radiofrequency power amplifier in an operating zone close to saturation. It is therefore desirable to nullify the effects of the amplification nonlinearities induced by the radiofrequency power amplifier, so as not to degrade the quality of transmission.

Several techniques are known for nullifying the effects of amplification nonlinearities. In the CLLT technique (standing for "Cartesian Loop Linear Transmitter"), a demodulator is used to servo control, in baseband and in analog, the modulation of the signal present at the level of the antenna with that of the baseband signal to be transmitted. In the ABP technique (standing for "Adaptive Baseband Predistortion"), a digital processing applied to the samples of the baseband signal to be transmitted makes it possible to distort this signal so as to obtain the desired radiofrequency signal at the level of the antenna. However, the implementation of these known techniques within the framework of a composite modulation is complex and necessitates thorough modification of the architecture of current transmitters.

This is why the present invention proposes a device for producing a phase and amplitude modulated radiofrequency signal relying on a technique known by the name of the EER technique (standing for "Envelope Elimination and Restoration"). According to this technique, the device comprises means of composite coding making it possible to generate on the basis of the data to be transmitted a first string of digital values corresponding to a phase modulation component of the output signal G and a second string of digital values corresponding to an amplitude modulation component of this signal. These two components are then transposed into the radiofrequency domain by distinct means. The components thus transposed are then combined to form the output signal G. Stated otherwise, the EER technique does not comply with the conventional scheme consisting in generating a phase and amplitude modulated baseband signal then in transposing this signal into the radiofrequency domain. This technique is advantageous since it makes it possible to retain a transmitter architecture close to that used within the framework of current systems using constant-envelope modulation.

The diagram of FIG. 1 gives an illustration of a device for generating a phase and amplitude modulated radiofrequency signal relying on the EER technique. The device comprises at least one data input 10 for receiving a digital message A containing data to be transmitted. It furthermore comprises composite means of coding such as a COD coder for generating, on the basis of said digital message A, a first string of digital values B and a second string of digital values C. The string B corresponds to a phase modulation component of the output signal G of the device. The string C corresponds to an amplitude modulation component of the output signal G. The device also comprises means for generating a phase control signal D and an amplitude control signal F on the basis of the first string of digital values B and of the second string of digital values C. The signals D and F are for example analog signals delivered by digital analog converters (not represented) of the generating means GEN. The digital values of the first string B and of the second string C are processed as samples of the phase control D and amplitude control F signals respectively.

The device also comprises phase modulation means MOD, an input of which receives the phase control signal D and an output of which delivers a radiofrequency signal of substantially constant amplitude and phase modulated E as a function of the phase control signal D. The device finally comprises a variable-gain radiofrequency power amplifier PA, the input of which is coupled to the output of the phase modulation means MOD so as to receive the radiofrequency signal E, a gain control input of which receives the amplitude control signal F, and an output of which delivers a phase and amplitude modulated radiofrequency signal. The signal G is the output signal from the device. This signal is suitable for radio transmission via an antenna. Thus, the output of the amplifier PA can be coupled to an antenna 30 for radio transmission of the signal G.

Since the phase modulation component and the amplitude modulation component are transposed from the baseband to the radiofrequency domain by distinct means, namely by the modulation means MOD and by the variable-gain radiofrequency power amplifier PA respectively, the phase modulation component and the amplitude modulation component follow different routes before being combined in the output signal G. Now, depending on the type of coding used, it is necessary for the phase modulation component to be synchronized with the amplitude modulation component in the signal transmitted, so as to allow correct decoding receiver-side and satisfactory spectral purity on transmission. It is therefore desirable to compensate for the differences in transmission times of these two components over their respective routes.

SUMMARY OF THE INVENTION

The invention thus proposes a device for producing a phase and amplitude modulated radiofrequency output signal suitable for radio transmission, comprising:
- at least one data input for receiving a digital message containing
- composite means of coding for generating, on the basis of said digital message, a first string of digital values corresponding to a phase modulation component of the output signal and a second string of digital values corresponding to an amplitude modulation component of the output signal;
- generation means for generating a phase control signal and an amplitude control signal on the basis of said first and second strings of digital values,
- phase modulation means, having an input and an output, said input receiving the phase control signal and said output delivering a radiofrequency signal of substantially constant amplitude and phase modulated as a function of the phase control signal; and
- a variable-gain radiofrequency power amplifier, having an input, a gain control input and an output, said input being coupled to an output of the phase modulation means so as to receive said phase modulated radiofrequency signal of substantially constant amplitude, said gain control input receiving the amplitude control signal, and said output delivering the output signal.

Said generating means comprise means of temporal clamping of said phase control signal and of said amplitude control signal for synchronizing the phase modulation component with the amplitude modulation component in the output signal.

The means of temporal clamping are further designed to carry out a temporal clamping of the phase control signal and of the amplitude control signal as a function of a baseband signal obtained on the basis of the output signal.

Said means of temporal clamping preferably comprise at least first digital means for applying a first delay to the first string of digital values or to the second string of digital values, in such a way that the phase modulation component is synchronized with the amplitude modulation component in the output signal. Such a digital solution has the advantage of allowing good integration of the device.

To obtain a high efficiency in terms of power, the radiofrequency power amplifier is preferably designed to operate in an operating zone close to saturation. This is why the invention proposes embodiments making it possible to nullify the effects of the amplitude and/or phase nonlinearities introduced in the amplifier.

In certain applications, the average power level of the output signal G may vary by stages, as a function of the operating mode of the transmitter incorporating the device. The stages of the average power level are controlled by the value of the DC component of the amplitude control signal F applied to the gain control input of the power amplifier, the AC component of this signal constituting the amplitude modulation pre-set. The invention proposes an embodiment making it possible in this case to limit the calculation load of the DSP and to avoid the need for a digital to analog converter of high resolution. In this embodiment, an analog signal for controlling the power level and an analog signal for controlling the amplitude modulation are generated separately and are added together in an analog manner before being applied to the gain control input of the variable-gain amplifier.

The invention furthermore proposes embodiments in which a correctly designed variable-gain amplifier makes it possible to circumvent the problem of the variation, with the value of the average power level of the radiofrequency signal to be transmitted, in the response of a detector forming part of analog means of servo control of the amplitude of the output signal to an amplitude modulation pre-set.

DETAILED DESCRIPTION

Figure 1:
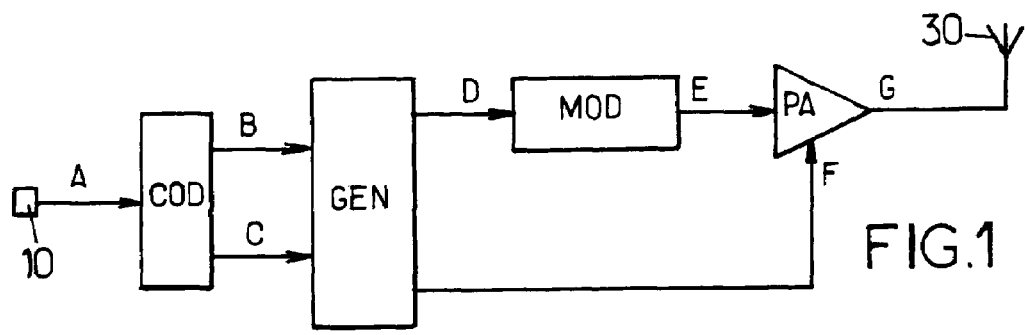
FIG. 1 is a diagram illustrating the principle of a device for producing a phase and amplitude modulated radiofrequency signal relying on the EER technique.

The invention proposes several embodiments of a device for producing a phase and amplitude modulated radiofrequency signal G suitable for radio transmission via a transmission antenna 30, which all rely on the EER technique as presented in the introduction with reference to FIG. 1. In the Figures and hereinbelow, the same elements bear the same references. Hereinbelow, the radiofrequency signal to be transmitted G is also referred to as the output signal of the device.

In all the embodiments presented, the generating means GEN have the function of producing the phase control signal D and the amplitude control signal F applied respectively as input to the phase modulation means MOD and to the variable-gain power amplifier PA. For an amplifier PA embodied in MOS technology, the amplitude control signal F determines for example a gate voltage, a drain voltage or an input power. For an amplifier PA embodied in bipolar technology, the amplitude control signal F determines for example a base voltage, a collector voltage or an input power. Conventionally, the signal F is an analog signal. It exhibits an AC component manifesting the amplitude modulation and a DC component which may be zero. In certain applications, the average power level of the output signal G varies by stages as a function of the operating modes of the transmitter incorporating the device. In this case, the average power level may be controlled by the value of the DC component of the control signal F.

The phase modulation means MOD consist for example of a phase locked loop oscillator (so-called PLL oscillator). In this case, the signal D is an analog signal. Nevertheless, the phase modulation means MOD preferably comprise a digital modulation synthesizer (DMS circuit). In this case, the signal D is a digital signal. This variant is advantageous since a DMS circuit allows better integration of the device. Specifically, a PLL oscillator comprises analog elements which occupy a great deal of room, by comparison with the small footprint of a DMS circuit. As need be, the means GEN comprise one or more digital to analog converters (not represented), for turning digital messages composed of the strings of digital values B and/or C into ad-hoc analog signals D and/or F respectively.

Figure 2:
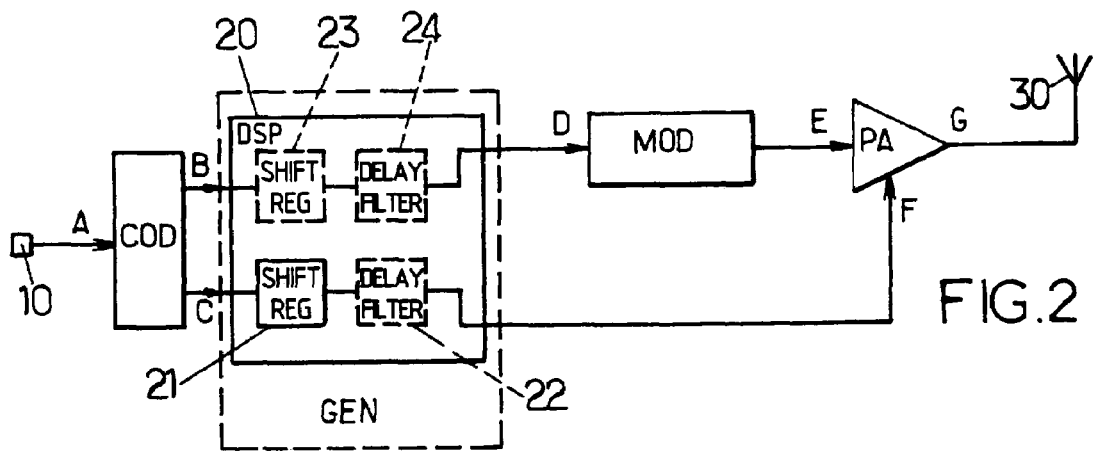
FIG. 2 is a diagram of a first embodiment of a device according to the invention.

In the embodiment of FIG. 2, said generating means GEN of the device comprise means of temporal clamping of said phase control signal D and of said amplitude control signal F in such a way that the phase modulation component is synchronized with the amplitude modulation component in the output signal G.

These means of temporal clamping preferably comprise first digital means 20 for applying a first delay T1 to the first string of digital values B or to the second string of digital values C. Such digital means are advantageously included in a digital signal processor (DSP circuit) which carry out all the digital functions of the generating means GEN. In general, the delay T1 is applied to the second string of digital values C, since the propagation time over the route followed by the amplitude modulation component is less than the propagation time over the route followed by the phase modulation component. However, this is not necessarily the case in all applications. Such digital means comprise for example a shift register 21 and/or a delaying filter 22 through which register and/or filter the string of digital values C to be delayed travels. A shift register makes it possible to introduce a delay equal to an integer number of times the period of a clock signal pacing the activity of the digital to analog converters concerned. It does not make it possible to obtain delay values other than those having discrete values, with a resolution equal to this period. A digital delaying filter makes it possible on the contrary to apply a delay equal to a fraction of this period. This is why it may be advantageous to combine them to apply a delay T1 of any value.

The digital filter preferably exhibits, at least in the band occupied by the coded message, a constant amplitude-response and a linear phase-response, the slope of the latter determining the value of the delay introduced by the filter. It may for example be a sampled and truncated sine cardinal filter delaying by a value τ, whose impulse response $f\tau(t)$ is given by relation (1) below:

$$f\tau(t) = \frac{\sin(\Pi(t-\tau)/Te)}{\Pi(t-\tau)/Te} \quad (1)$$

where 1/Te is the bit rate of the digital values in the digital message A.

Preferably the digital filter is a digital version of the sine cardinal, whose impulse response $f\tau(t)$ is given by relation (2) below:

$$f\tau(t) = \frac{\sin(\Pi(t-\tau)/Te)}{N\sin(\Pi(t-\tau)/NTe)} \quad (2)$$

where 1/Te is the bit rate of the digital values in the digital message A and where N is an integer number, called the length of the filter, which corresponds to the number of successive digital values processed simultaneously by the filter. Such a filter introduces a delay whose value is equal to half the length of the filter plus a small additional delay, positive or negative, which is equal to a fraction of the time Te i.e. τ.

In certain cases, it is preferable to provide moreover second digital means, such as a shift register 23 and/or a delaying digital filter 24 for applying a second delay T2, different from the delay T1, to the other string of digital values B. In this case, the equivalent delay applied to the second string of digital values C with respect to the first string of digital values B is equal to T1−T2. This makes it possible to apply an equivalent delay of finer value.

In the embodiment of FIG. 2, the delay applied is determined once and for all during a calibration phase which may be carried out in the laboratory. In general, it is then the same for each and every device manufactured.

Figure 3:
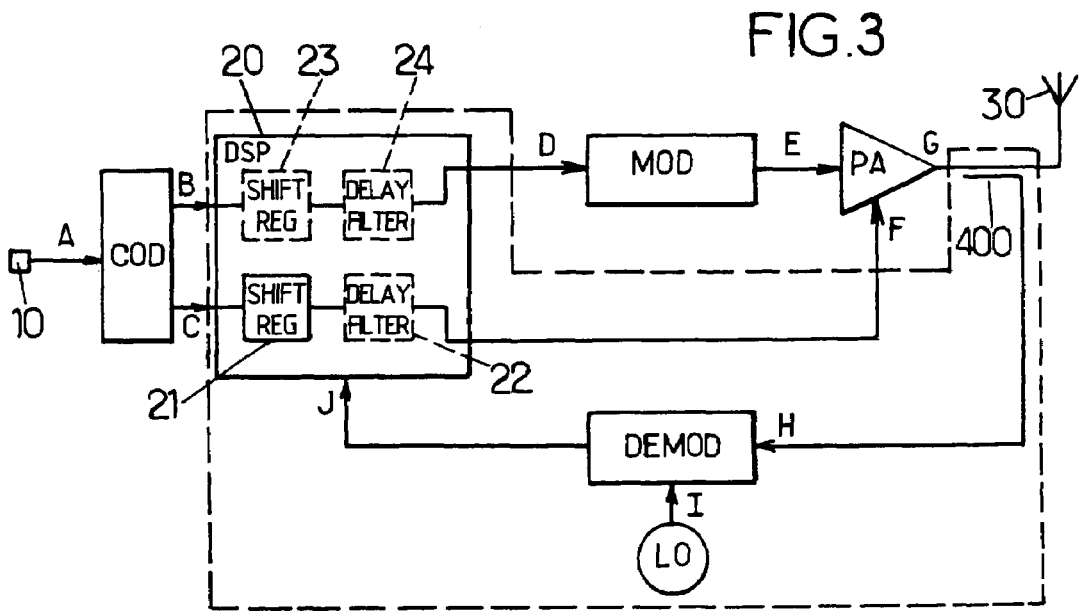
FIG. 3 is a diagram of a second embodiment of a device according to the invention.

In another embodiment in accordance with FIG. 3, the means of temporal clamping are designed to carry out a temporal clamping of the phase control signal D and of the amplitude control signal F as a function of a baseband signal J obtained on the basis of the output signal G.

Accordingly, the device comprises means forming a baseband return pathway, so as to produce a baseband signal J corresponding to the output signal G. These means comprise a coupling device 400 which picks up at the output of the power amplifier PA a part of the power of the output signal G, and delivers a signal H which is the image, in terms of phase modulation and amplitude modulation, of the output signal G. Furthermore, they comprise demodulation means DEMOD which receive on an input the signal H and deliver on an output said baseband signal J. The demodulation means DEMOD furthermore receive a radiofrequency signal I of the same frequency as the carrier frequency, and which is mixed with the signal H to ensure the baseband return of this signal. This signal I is for example delivered by a local oscillator LO. The baseband signal J and the baseband signal to be transmitted are very close. They differ only by the effect of the imperfections of the clamping of the phase control D and amplitude control F signals, and by the effect of the amplification nonlinearities introduced into the output signal G by the radiofrequency power amplifier PA. The signal J is sampled and converted into digital data by means of an analog to digital converter (not represented) of the generating means GEN. These digital values are taken into account when adjusting the delay applied by the means of temporal clamping. In an example, the length N of the digital filter 22 or 24 given by relation (2) above is made to vary. Likewise, it is possible to move a reading pointer in the shift register 21 or 23, this amounting to varying its length.

As a variant, the signal I can be replaced with the signal E, which is the phase modulated signal of substantially constant amplitude delivered at the output of the modulation means MOD. In this case, the baseband signal J is representative of the imperfections of the clamping of the phase control D and amplitude control F signals, and of the effect of the amplification nonlinearities introduced into the output signal G by the radiofrequency power amplifier PA.

This embodiment makes it possible to carry out servo control of the temporal clamping of the phase control D and amplitude control F signals as a function of the output signal G. The delay to be applied by the means of temporal clamping 20 is determined as a function of the digital values obtained on the basis of the signal J. In this way, the temporal clamping of the signals D and F takes account in particular of any scatter in the characteristics of the analog constituents of the device (which are present essentially in the amplifier PA), of the drifting with temperature and of the effects of ageing on the value of these constituents.

Figure 4:
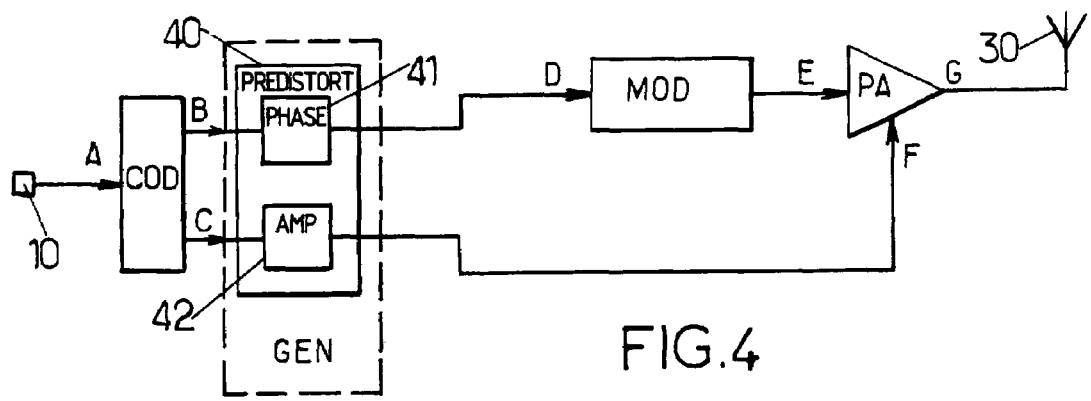
FIG. 4 is a diagram of a third embodiment of a device according to the invention.

In another embodiment in accordance with FIG. 4, the generating means GEN comprise digital means of predistortion 40, including phase predistortion means 41 and/or amplitude predistortion means 42. These means make it possible to nullify the effect of the amplification nonlinearities (in terms of phase and/or amplitude respectively).

The phase predistortion means 41 comprise a first table of values associating a predistorted digital value with each digital value of the first string of digital values B. Stated otherwise, each digital value of the string B is replaced in said string by a digital value of the first predistortion table which is associated therewith. Hence, the phase control signal D is generated as a function of the string of said predistorted digital values in such a way as to nullify the effect of the phase nonlinearities introduced into the output signal G by the amplifier PA. The amplitude predistortion means 42 comprise a second table of values associating a predistorted digital value with each digital value of the second string of digital values C. Stated otherwise, each digital value of the string C is replaced in said string by a digital value of the second predistortion table which is associated therewith. In this way, the amplitude control signal F is generated as a function of the string of said predistorted digital values, thereby making it possible to nullify the effect of the amplitude nonlinearities introduced into the output signal G by the amplifier PA.

In the embodiment of FIG. 4, the values of the first and/or of the second predistortion tables are determined during a calibration phase which may be carried out in the laboratory. They are therefore constant throughout the life of the radio communication equipment. In general, they are identical for each and every device manufactured.

Figure 5:
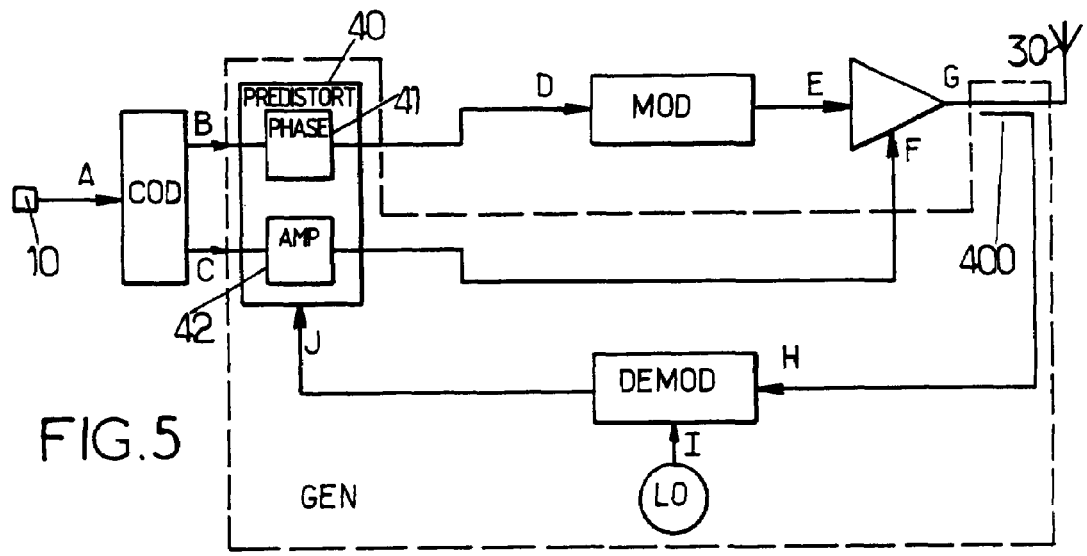
FIG. 5 is a diagram of a fourth embodiment of a device according to the invention.

In another embodiment in accordance with FIG. 5, the predistortion means 40, that is to say the phase predistortion means 41 and/or the amplitude predistortion means 42, are designed to carry out a predistortion as a function of a baseband signal J obtained on the basis of the output signal G. Stated otherwise, the means 41 carry out an adaptive phase predistortion of the digital values of the string B and/or the means 42 carry out an adaptive amplitude predistortion of the digital values of the string C. One speaks of adaptive predistortion in so far as it takes into account, in a continuous manner, the actual amplification distortions introduced by the amplifier PA into the output signal G.

Accordingly, the device comprises the aforesaid means forming a baseband return pathway, that is to say the coupling device 400, the demodulation means DEMOD, and as the case may be, the local oscillator LO which have been presented hereinabove with reference to the embodiment of FIG. 3, the baseband signal J being supplied as input to the means 40. Although these embodiments are independent, these elements are identical in their structure and their manner of operation, so that it is unnecessary to describe them again in detail in their application to the embodiment of FIG. 5. It will be noted simply that the digital data obtained by sampling and analog to digital conversion of the baseband signal J are taken into account when updating the first and/or the second predistortion table. This updating can be carried out according to any adaptive algorithm suitable for this purpose.

It will be appreciated that in the embodiment of FIG. 4 as in that of FIG. 5, the predistortion means 40 may comprise only the phase predistortion means 41 or only the amplitude predistortion means 42, or may comprise both the phase predistortion means 41 and the amplitude predistortion means 42. Specifically these two types of means are independent in their structure and in their function.

Figure 6:
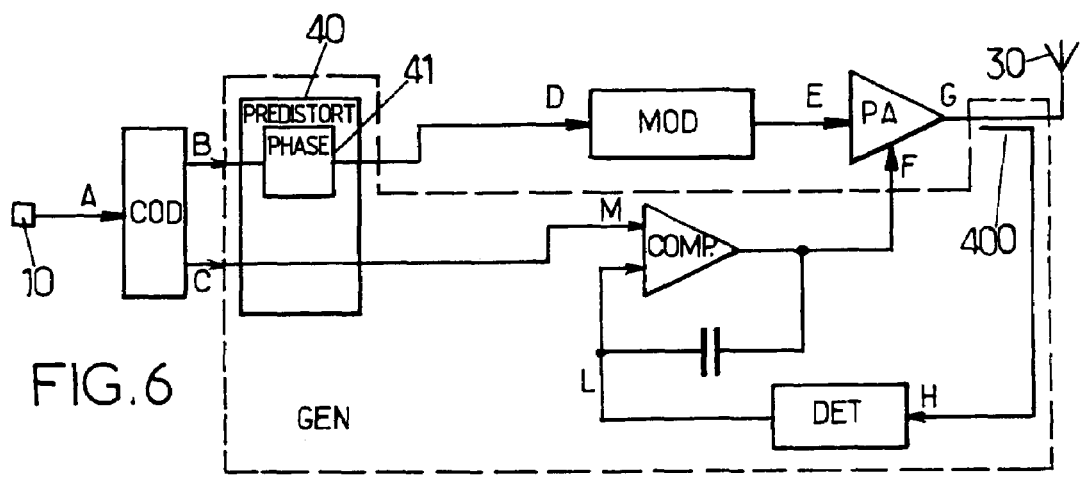
FIG. 6 is a diagram of a fifth embodiment of a device according to the invention.

In another embodiment, in accordance with FIG. 6, the generating means GEN comprise predistortion means 40 including phase predistortion means 41 but no amplitude predistortion means. Instead, the generating means GEN further comprise analog means of servo control of the amplitude of the output signal G to an amplitude modulation pre-set M generated on the basis of the digital values of the second string of digital values C associated with the amplitude modulation component. This pre-set M is an analog signal obtained by means of a digital to analog converter. These analog means of servo control comprise an amplifier COMP operating as an integrator, a first input of which receives the pre-set M, a second input of which receives an analog signal L, and the output of which delivers the gain control signal F which is applied to the gain control input of the amplifier PA. They further comprise coupling means, which may be the coupling means 400 of the embodiments of FIGS. 3 and 5, delivering the signal H which is the image of the output signal G. They finally comprise a detector DET, the input of which receives the signal H and the output of which delivers the signal L. The function of the detector DET is to extract the amplitude modulation component of the output signal G from the signal H, by applying a rectification and a low-pass filtering to the signal H in such a way that the voltage amplitude of the signal L, conventionally expressed in decibels (dBv), is dependent on the instantaneous power of the signal H, conventionally expressed in decibels (dBm). The signal L is therefore representative of the amplitude modulation component actually present in the output signal G. The signal L and the signal M are very close together, and differ only by the effect of the amplitude nonlinearities introduced into the output signal G by the amplifier PA. The signal L is compared by the integrator amplifier COMP with the pre-set M, to produce the amplitude control signal F as a function of their difference.

As will have been understood, the analog means of servo control of the amplitude of the output signal G to the amplitude modulation pre-set M fulfil substantially the same function as the amplitude predistortion means 42 of the embodiments of FIG. 4 and of FIG. 5, namely to compensate for the effects of the amplitude nonlinearities of the amplifier PA.

Figure 7:
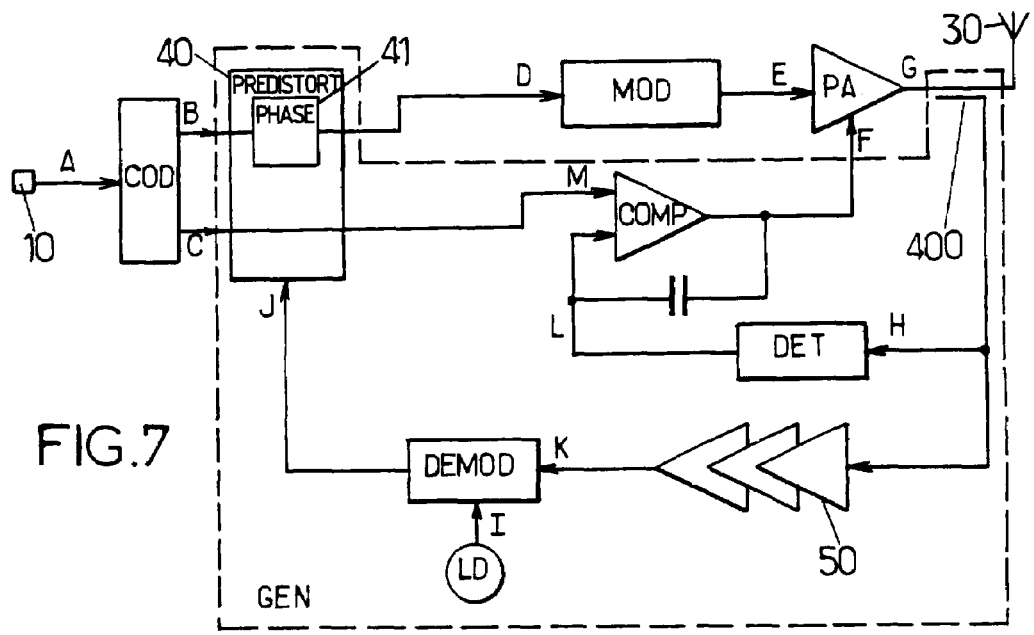
FIG. 7 is a diagram of a sixth embodiment of a device according to the invention.

In another embodiment, in accordance with the diagram of FIG. 7, a device according to the invention is distinguished from that of FIG. 6 in that the phase predistortion means 41 are designed to carry out an adaptive phase predistortion, as a function of a baseband signal J obtained on the basis of the output signal G. Accordingly, the device comprises the aforesaid means forming a baseband return pathway, namely the coupling device 400, the demodulation means DEMOD, and, as the case may be, the local oscillator LO which have been presented hereinabove with reference to the embodiment of FIG. 3. However, it will be noted that these embodiments are independent. The digital data obtained by sampling and analog to digital conversion of the baseband signal J are taken into account when updating the first predistortion table. This updating may be carried out according to any adaptive algorithm suitable for this purpose. The advantage of the embodiment of FIG. 7 lies in the fact that, the baseband signal J not being used to compensate for the effects of the amplitude nonlinearities of the amplifier PA, it is unnecessary to impose severe amplitude linearity constraints on the return pathway. In a preferable but non-limiting manner, the means forming a baseband return pathway comprise a limiter 50 inserted between the coupling means 400 and the demodulation means DEMOD. This limiter receives the signal H on an input and delivers a signal K on its output, which is coupled to the input of the demodulation means DEMOD. This signal K corresponds to the signal H ridded of the amplitude modulation. Stated otherwise, the signal K is a signal of constant amplitude, which is the image of the output signal G in terms of phase modulation. This makes it possible to supply a signal K of constant amplitude as input to the demodulation means DEMOD, thereby simplifying the practical embodiment of these means DEMOD.

Figure 8:
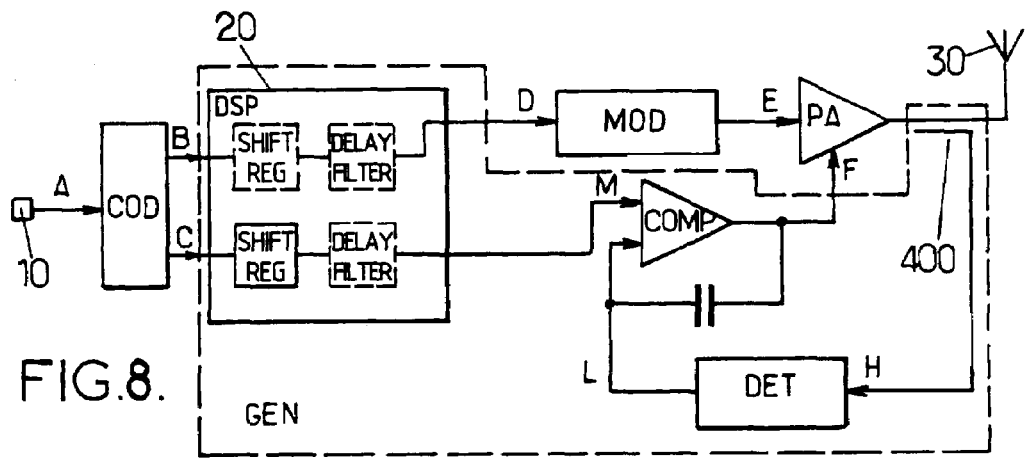
FIG. 8 is a diagram of a seventh embodiment of a device according to the invention.

In the embodiment of FIG. 8, the device according to FIG. 2 is supplemented with the analog means of servo control of the amplitude of the output signal G to an amplitude modulation pre-set M generated on the basis of the second string of digital values C, which means have been presented hereinabove with reference to the embodiment of FIG. 6.

Figure 9:
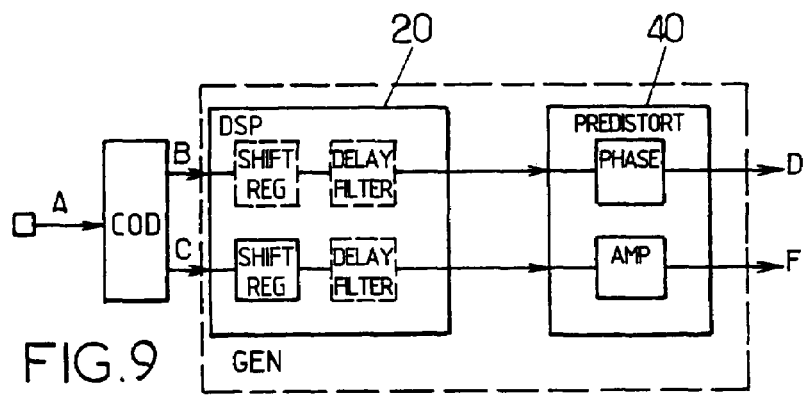
FIG. 9 is a partial diagram of an eighth embodiment of a device according to the invention.

In the embodiment of FIG. 9, the temporal clamping means 20 presented hereinabove with reference to the embodiment of FIG. 2 are combined with the phase and amplitude predistortion means 40 presented hereinabove with reference to the embodiment of FIG. 4. These two types of means are arranged in series, the means of temporal clamping 20 being upstream of the phase and amplitude predistortion means 40 as shown in the Figure or vice versa.

Figure 10:
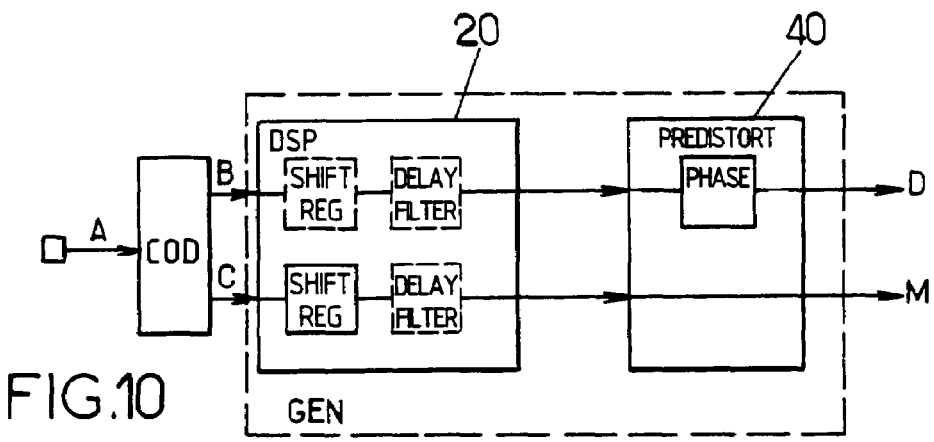
FIG. 10 is a partial diagram of a ninth embodiment of a device according to the invention.

In the embodiment of FIG. 10, the temporal clamping means 20 presented hereinabove with regard to FIG. 2 are combined with the phase predistortion means 40 presented hereinabove with regard to FIG. 6. These two types of means are arranged in series, the means of temporal clamping 20 being upstream of the phase predistortion means 40, as shown in the Figure or vice versa.

In certain applications, the average power level of the output signal G can vary as a function of the operating mode of the transmitter incorporating the device. In general, it varies by stages between a minimum level for example equal to 21 dBm and a maximum level for example equal to 33 dBm. In this case these stages are controlled by the value of the DC component of the control signal of amplitude F applied to the gain control input of the amplifier PA, the AC component of this signal constituting the amplitude modulation pre-set itself. Now, the aggregate constraints of accuracy of the average power level of the output signal G (for example +/−3 dBm for the most critical power level, namely the minimum power level) and of accuracy of the amplitude modulation of this signal (for example −60 dBv for the minimum level) necessitate a coding for example on at least 13 bits of the digital values of the amplitude control analog signal F (embodiments of FIGS. 1 to 5 and 9) or of the amplitude modulation pre-set analog signal M (embodiments of FIGS. 6 to 8 and 10) having a DC component such as this and an AC component such as this. According to a first drawback, this involves the use of a digital to analog converter operating on 13 bits as input. Such a digital to analog converter is hardly conceivable for an equipment such as a mobile radio communication station, for reasons of both cost and integration. According to a second drawback, this involves for the DSP the requirement of processing data coded on 13 bits, thereby penalizing the performance of the device in terms of calculation speed.

Figure 11:
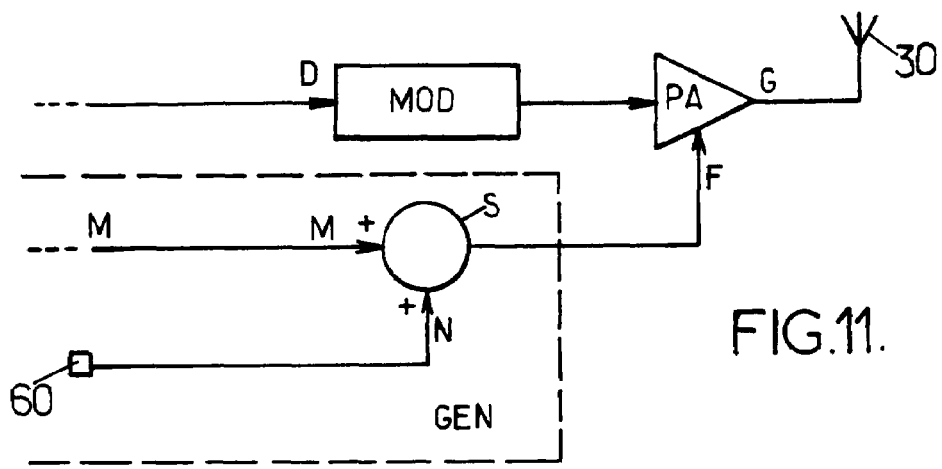
FIG. 11 is a diagram of a tenth embodiment of a device according to the invention.

The invention proposes an embodiment, in accordance with FIG. 11, making it possible to alleviate these drawbacks. In FIG. 11, a first analog signal M comprising only the amplitude modulation component (i.e., having a zero DC component), is generated by means of a digital to analog converter operating for example on 11 bits at input. A second analog signal N is generated by means of another digital to analog converter operating for example on 7 bits at input, this signal N being a DC signal whose value controls the value of the average power level of the output signal G. Thus, the DSP processes only data coded on respectively 11 and 7 bits instead of 13. Furthermore, it is more advantageous to use two digital to analog converters operating on respectively 11 and 7 bits at input than just one operating on 13 bits at input. A summator circuit S receives the signal M on a first input and the signal N on a second input, and delivers on its output the amplitude modulation control signal F resulting from the sum of said signals M and N. The summator circuit S is an analog circuit based for example on operational amplifiers. As in the previous embodiments, the amplitude modulation control signal F is brought to the gain control input of the power amplifier PA, and the phase modulation control signal D is carried to the input of the modulator MOD, the output of which is brought to the input of the amplifier PA. The output of the amplifier PA is linked to the antenna 30 for the transmission of the output signal G. The device comprises a power level input 60 for receiving the analog signal N for controlling the average level of the power of the output signal G. This input is linked to the output of a digital to analog converter (not represented) operating on 7 bits at input and coupled to an output of the DSP (likewise not represented).

Figure 15:
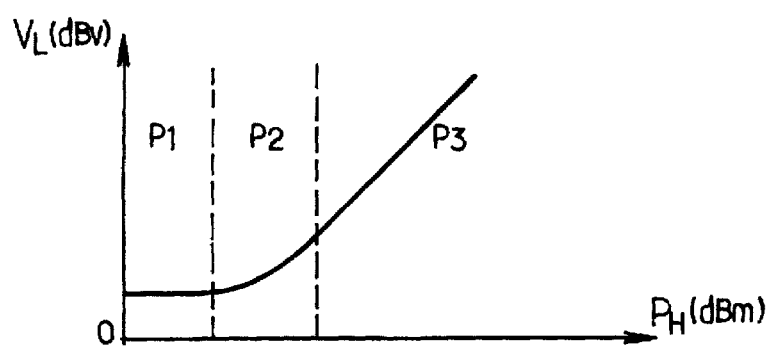
FIG. 15 is a graph showing the input/output characteristic of a detector forming part of analog means of servo control of the amplitude of the output signal of the device according to the invention.

Of course, the embodiment of FIG. 11 may advantageously be combined with the analog means of servo control of the amplitude of the output signal G to an amplitude modulation pre-set (embodiments of FIGS. 6 to 8). However, the slope of the input/output characteristic of the detector DET depends on the value of the average power level of the signal H, that is to say in fact on the average power level of the output signal G. The graph of FIG. 15 gives the schematic shape of this characteristic. The input value of the detector DET is constituted by the power level $P_H$ of the signal H, expressed in dBm and plotted on the abscissa axis of the graph. The output value of the detector DET is constituted by the voltage level $V_L$ of the signal L expressed in dBv and plotted on the ordinate axis. As indicated by the graph of FIG. 15, the input/output characteristic of the detector DET comprises three different portions P1, P2 and P3. In portion P1, the closest to the origin O, the slope of the characteristic is zero, this manifesting the fact that the input is below the detection threshold of the detector. In portion P2, the slope of the characteristic alters between the zero value and a non zero determined value (which is almost equal to one in FIG. 15). Finally, in portion P3, the slope of the characteristic is constant and is equal to said non zero determined value. It follows that, to obtain one and the same amplitude modulation of the output signal G for two different values of the average power level of this signal, it may be necessary to generate an amplitude modulation pre-set, that is to say an AC component of the amplitude control signal F, which depends on the average power level of the radiofrequency signal to be transmitted, that is to say on the DC component of the amplitude control signal F. The phenomenon described hereinabove implies that additional processing of the digital data is required. This processing is a digital processing which includes multiplications or other additional calculations as a function of the value of the signal N for controlling the average level of the power of the output signal G, so that account be taken thereof in the production of the amplitude modulation pre-set M. This digital processing raises the calculation load of the DSP. It will moreover be noted that a digital processing of the same nature, although simpler to implement, would also be required if the detector DET were used under operating conditions ensuring retention in portion P3 of its characteristic which is linear. Specifically, it is in any event necessary to adapt the amplitude modulation pre-set M to the value of the average power level of the output signal resulting from the signal N for controlling the average power level of the output signal G. One speaks of "scaling" to designate this adaptation.

The invention proposes embodiments achieving a simple and effective analog response to these problems, while avoiding the need to modify by numerical calculation, according to the average level of the power of the radiofrequency signal to be transmitted, as indicated by the value of the control signal N, the digitally generated amplitude modulation pre-set M.

Figure 12:
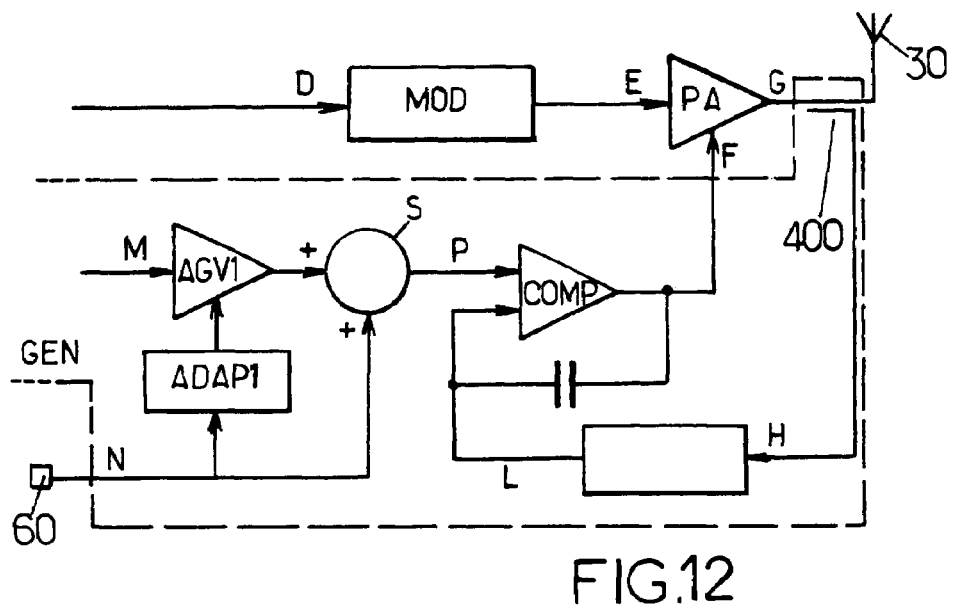
FIG. 12 is a partial diagram of an eleventh embodiment of a device according to the invention.

Specifically, the invention proposes an embodiment in accordance with FIG. 12 which constitutes a combination of one of the embodiments of FIGS. 6 to 10 on the one hand and 11 on the other hand. In this embodiment, the device includes analog means of servo control of the amplitude of the output signal G to an amplitude modulation pre-set M. Moreover, a variable-gain amplifier/attenuator AGV1 and an analog summator S are arranged between the output of the predistortion means 40 (embodiments of FIGS. 6, 7, 9 and 10) or of the temporal means of clamping between the phase control signal and the amplitude control signal (embodiment of FIG. 8) on the one hand, and the first input of the comparator amplifier COMP on the other hand. Thus, the input of the amplifier/attenuator AGV1 receives the amplitude modulation pre-set M which is then preferably purely AC, that is to say of zero DC component and independent of the average power level of the output signal G. The output of the amplifier/attenuator AGV1 is linked to a first input of the summator S. The device comprises a power level input 60 for receiving an analog signal N for controlling the average level of the power of the output signal G. The input 60 is linked, on the one hand to a second input of the summator S, and on the other hand to a gain control input of the amplifier/attenuator AGV1, possibly via an adaptation circuit ADAP1, so as to deliver thereto the signal N. The output of the summator S is linked to the first input of the comparator amplifier COMP so as to deliver thereto a signal P having as DC component the signal N and as AC component the signal M multiplied by the gain of the amplifier/attenuator AGV1. The summator S has the function of adding together the signal N and the phase modulation pre-set M to produce the signal P. The amplifier/attenuator AGV1 thus connected, associated as the case may be with the adaptation circuit ADAP1, therefore has the function of adapting the AC component of the amplitude control signal F to the average power level of the output signal G, on the basis of an amplitude modulation pre-set M independent of this level. This is achieved by controlling the gain of the amplifier/attenuator AGV1 as a function of the signal N for controlling the average power level of the output signal G, in such a way as to compensate for the variation in the slope of the input/output characteristic of the detector DET with the average power level of said output signal G on the one hand, and to ensure the scaling of the amplitude modulation pre-set M on the-other hand. In this way, the amplitude modulation pre-set M generated by the DSP does not depend on the value of the signal N, that is to say on the average level of the power of the signal to be transmitted.

Figure 13:
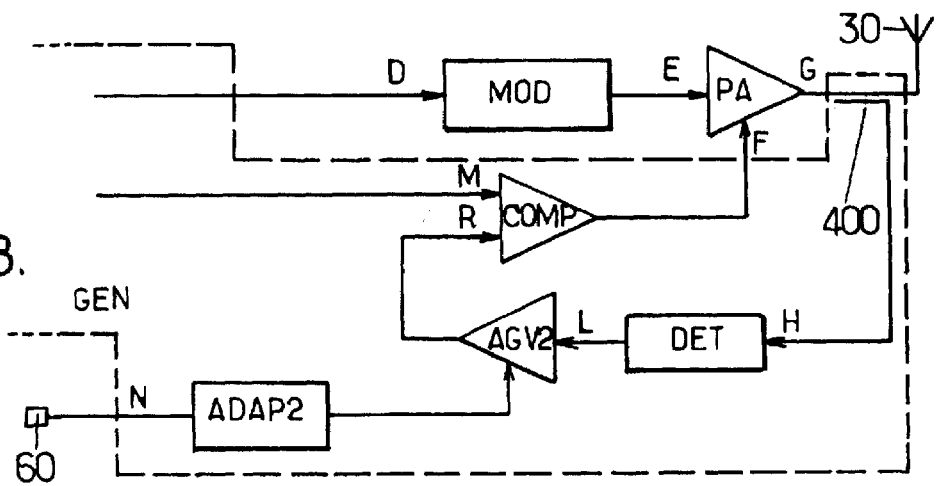
FIG. 13 is a partial diagram of a twelfth embodiment of a device according to the invention.

In a variant in accordance with the embodiment of FIG. 13, the device comprises instead of the amplifier/attenuator AGV1 a variable-gain amplifier/attenuator AGV2 arranged downstream of the detector DET. More exactly, the input of the amplifier/attenuator AGV2 is linked to the output of the detector DET in such a way as to receive the signal L delivered by this detector. The output of the amplifier/attenuator AGV2 is linked to the second input of the comparator amplifier COMP so as to deliver a signal R. The signal R is the product of the signal L times the gain of the amplifier/attenuator AGV2. The input 60 of the device is linked to a gain control input of the amplifier/attenuator AGV2, possibly via an adaptation circuit ADAP2, so as to deliver thereto the analog signal N for controlling the average power level of the output signal G. Thus connected, the amplifier/attenuator AGV2 associated as the case may be with the adaptation circuit ADAP2, also has the function of rendering the analog signal M independent of the average power level of the output signal G. The average power level of the output signal G is in fact determined by the value of the signal R which is the value of the voltage L detected by the detector DET and multiplied by the value of the gain of the amplifier/attenuator AGV2. The gain of this amplifier is controlled, as the case may be, by virtue of the adaptation circuit ADAP2, in such a way as to compensate for the variation in the slope of the input/output characteristic of the detector DET with the average power level of the output signal G. In this variant, and contrary to the embodiment of FIG. 11, the amplitude modulation pre-set M comprises an AC component independent of the average power level of the signal to be transmitted, and a constant DC component which determines this level. It will be noted that the amplifier/attenuator AGV2 may also be arranged upstream of the detector DET. In this case (not represented), its input is linked to the coupling means 400 so as to receive the signal H and its output is linked to the input of the detector DET so as to deliver thereto the signal H multiplied by the gain of the amplifier/attenuator AGV2, the output of the detector DET being linked to the second input of the comparator amplifier COMP as in FIGS. 6, 7 or 8.

The analog means of servo control of the amplitude of the output signal G to the amplitude modulation pre-set M bring about a phase shift between the amplitude modulation pre-set M and the amplitude modulation component actually present in the output signal G. This phase shift depends on the frequency of the amplitude modulation. Conventionally, this phase shift is linear for the low frequencies and may be regarded as a delay. The value of this delay depends on the cutoff frequency of the analog device for closed-loop amplitude servo control. The higher this cutoff frequency, the smaller the delay. Now, the transfer function of the closed-loop device is not independent of the average power level of the output signal G. Specifically, in particular, the slope of the Control Voltage/Gain characteristic of the power amplifier PA depends on the DC component of the amplitude control signal F which it receives on its gain control input. This variation in slope brings about a variation in the gain of the open-loop device, hence a variation in the cutoff frequency of the closed-loop device, and therefore a variation in the aforesaid delay. This variation in the delay between the amplitude modulation pre-set M and the amplitude modulation component actually present in the output signal G as a function of the average power level of the output signal G is prejudicial to the means of temporal clamping of the phase control signal D and of the amplitude control signal F.

One means of limiting the variation in the cutoff frequency of the closed-loop device consists in increasing the cutoff frequency of the closed-loop device. However, this may impair the stability of the amplitude servo control loop and result in an increase in the level of noise in the spectrum of the output signal G. Another means consists in increasing the gain of the comparator amplifier COMP. However, this may also harm the stability of the amplitude servo control loop and result in an increase in the level of noise in the spectrum of the output signal G, and may moreover result in an increase in the power error in the output signal G due to the residual offset at the input of the comparator amplifier COMP.

Figure 14:
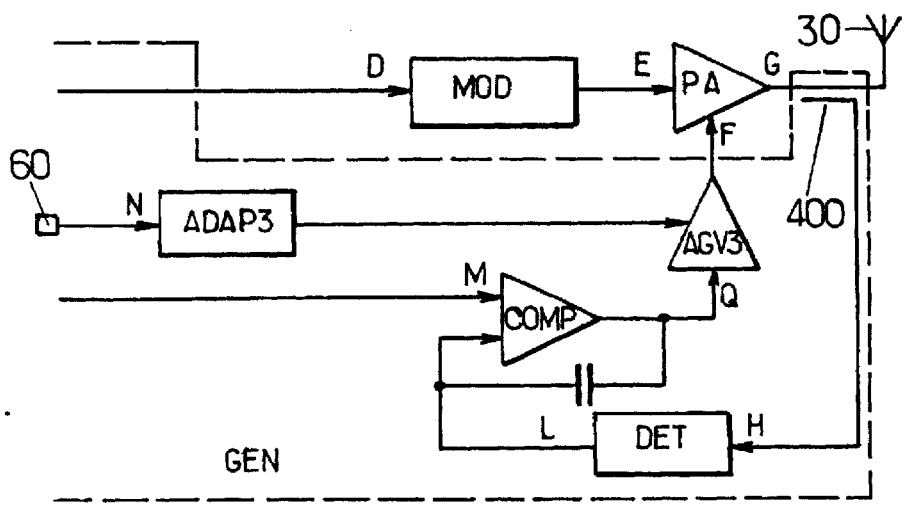
FIG. 14 is a partial diagram of a thirteenth embodiment of a device according to the invention.

This is why, in an embodiment in accordance with FIG. 14, the device according to the invention comprises a variable-gain amplifier/attenuator AGV3 arranged between the output of the comparator amplifier COMP and the gain control input of the power amplifier PA. More precisely, the input of the amplifier/attenuator AGV3 is linked to the output of the comparator amplifier COMP. Thus the signal Q delivered by the output of the comparator amplifier COMP is supplied as input to the amplifier AGV3. The output of the amplifier/attenuator AGV3 is linked to the gain control input of the power amplifier PA so as to deliver the amplitude control signal F. The power level input 60 is linked to a gain control input of the amplifier/attenuator AGV3, possibly via an adaptation circuit ADAP3, so as to deliver thereto the analog signal N for controlling the average power level of the output signal G which is a signal indirectly representative of the slope of the Control Voltage/Gain characteristic of the power amplifier PA. The function of the amplifier/attenuator AGV3 thus connected, and associated as the case may be with the adaptation circuit ADAP3, is to compensate for the variation, with the value of the average power level of the output signal G, in the cutoff frequency of the analog means of servo control of the amplitude of the output signal G to the amplitude modulation pre-set M. This is achieved by controlling the gain of the amplifier AGV3 as a function of said signal N in such a way as to compensate for the variation, with the value of the average power level of the output signal G, in the cutoff frequency of the analog means of servo control of the amplitude of the output signal G to the amplitude modulation pre-set M. In this embodiment, the amplitude modulation pre-set M comprises an AC component and a constant DC component which determines this level.

It will be noted that the respective gains of the amplifier/attenuator AGV1, AGV2 and/or AGV3 may be less than 1, which amounts to saying that each amplifier/attenuator can introduce an amplification or an attenuation.

The embodiments presented hereinabove with reference to FIGS. 2 to 14 combine well with a view to the embodying of a device for generating a phase and amplitude modulated radiofrequency signal exhibiting good performance under various operating conditions. However, it will be appreciated that they may also be applied independently of one another, as a function of the objectives required and/or of the particular features of the application of the device. This is especially true of the embodiments including means 20 of temporal clamping of the phase control signal and of the amplitude control signal, of those including the means 40 of phase and/or amplitude adaptive predistortion, of those including the means of servo control of the amplitude of the output signal to an analog amplitude modulation pre-set M, of those including an analog summator S for adding an analog signal for controlling the average power level of the output signal G to an analog signal of amplitude modulation pre-set of this signal G (FIGS. 11 and 12), of those including the amplifier/attenuator AGV1 (FIG. 12) or the amplifier/attenuator AGV2 (FIG. 13), and of those including the amplifier/attenuator AGV3 (FIG. 14).

The invention claimed is:

1. A device for producing a phase and amplitude modulated radiofrequency output signal suitable for radio transmission, comprising:
   at least one data input for receiving a digital message containing data to be transmitted;
   composite means of coding for generating, on the basis of said digital message, a first string of digital values corresponding to a phase modulation component of the output signal and a second string of digital values corresponding to an amplitude modulation component of the output signal;
   means for generating a phase control signal and an amplitude control signal on the basis of said first and second strings of digital values,
   phase modulation means, having an input and an output, said input receiving the phase control signal and said output delivering a radiofrequency signal of substantially constant amplitude and phase modulated as a function of the phase control signal; and
   a variable-gain radiofrequency power amplifier, having an input, a gain control input and an output, said input being coupled to the output of the phase modulation means so as to receive said phase modulated radiofrequency signal of substantially constant amplitude, said gain control input receiving the amplitude control signal, and said output delivering the output signal,
   wherein said means for generating comprise means of temporal clamping of said phase control signal and of the amplitude control signal so as to synchronize the phase modulation component with the amplitude modulation component in the output signal,
   and wherein said means of temporal clamping are designed to carry out a temporal clamping of the phase control signal and of the amplitude control signal as a function of a baseband signal which is obtained on the basis of the output signal.

2. The device as claimed in claim 1 wherein said means of temporal clamping comprise digital delay means for applying a first delay to a first one of the first string of digital values and the second string of digital values.

3. The device as claimed in claim 2 wherein said digital delay means further apply a second delay, different from said first delay, to a second one of the first string of digital value and the second string of digital values.

4. The device as claimed in claim 2, wherein said digital delay means comprise a shift register.

5. The device as claimed in claim 2, wherein said digital delay means comprise a delaying digital filter.

6. The device as claimed in claim 5 wherein the delaying digital filter (24) comprises a sine cardinal filter.

7. The device as claimed in claim 1 further comprising a coupling device for picking up at the output of the power amplifier a signal which is the image of the output signal, a demodulator having an input and an output, said input receiving said signal which is the image of the output signal and said output delivering said baseband signal.

8. The device as claimed in claim 1 wherein the means for generating further comprise digital means of predistortion comprising a first table of values which associates a phase predistorted digital value with each digital value of the first string of digital values, the phase control signal being generated as a function of said phase predistorted digital values.

9. The device as claimed in claim 1 wherein the means for generating further comprise digital means of predistortion comprising a second table of values which associates an amplitude predistorted digital value with each digital value of the second string of digital values, the amplitude control signal being generated as a function of said amplitude predistorted digital values.

10. The device as claimed in either of claim 8 or 9 wherein the means of predistortion are designed to carry out an adaptive predistortion as a function of a baseband signal which is obtained on the basis of the output signal.

11. The device as claimed in claim 1, wherein the means for generating further comprise analog means of servo control of the amplitude of the output signal to a first analog signal corresponding to an amplitude modulation pre-set which is generated on the basis of the second string of digital values.

12. The device as claimed in claim 11 wherein said analog means of servo control comprise coupling means delivering a signal which is the image of the output signal, a detector having an input and an output, said input receiving the signal which is the image of the output signal and said output delivering a signal which is representative of the amplitude modulation component actually present in the output signal, a comparator amplifier having a first input, a second input and an output, said first input receiving the first analog signal, said second input receiving said signal representative of the amplitude modulation component actually present in the output signal and said output delivering the amplitude control signal which is applied to the gain control input of the power amplifier.

13. The device as claimed in claim 12, further comprising a power level input (60) for receiving a second analog signal (N), a summator circuit having a first input, a second input and an output, said first input receiving said first analog signal, said second input receiving said second analog signal and said output delivering the amplitude control signal resulting from the sum of said first analog signal and said second analog signal.

14. The device as claimed in claim 13, further comprising a first amplifier/attenuator circuit having an input, a gain control input and an output, and an analog summator circuit having a first input, a second input and an output, said input of said first amplifier/attenuator receiving the first analog signal and its output being linked to said first input of the summator circuit, the power level input being linked to said second input of the summator circuit, and to said gain control input of the first amplifier/attenuator said output of the summator circuit being linked to said first input of the comparator amplifier whereby the output of the comparator amplifier delivers a signal having as DC component the second analog signal and as AC component the first analog signal multiplied by the gain of the first amplifier/attenuator circuit, said gain being controlled as a function of the second analog signal.

15. The device as claimed in claim 14 wherein the DC component of the first analog signal is zero.

16. The device as claimed in claim 14, wherein the power level input is linked further to the gain control input of the first amplifier/attenuator circuit via a first adaptation circuit which controls the gain of the first amplifier/attenuator circuit as a function of the second analog signal.

17. The device as claimed in claim 13 further comprising a second amplifier/attenuator circuit arranged upstream or downstream of the detector and having an input, a gain control input and an output, the power level input being linked to said gain control input of the second amplifier/attenuator circuit, and the gain of said second variable-gain amplifier circuit being controlled as a function of the second analog signal.

18. The device as claimed in claim 17 wherein the power level input is linked to the gain control input of the second amplifier/attenuator circuit via a second adaptation circuit which controls the gain of the second amplifier/attenuator circuit as a function of the second analog signal.

19. The device as claimed in claim 13, further comprising a third variable-gain amplifier/attenuator having an input, a gain control input and an output, said input being linked to the output of the comparator amplifier, the output of the comparator amplifier being linked to the gain control input of the power amplifier, the power level input being linked to said gain control input of the third amplifier/attenuator circuit, the gain of said third variable-gain amplifier being controlled as a function of the second analog signal.

20. The device as claimed in claim 19 wherein the power level input is linked to the gain control input of the third amplifier/attenuator circuit via a third adaptation circuit which controls the gain of the amplifier/attenuator circuit.

21. The device as claimed in claim 1 wherein the phase modulation means comprise a digital modulation synthesizer.

* * * * *